United States Patent [19]
Seo et al.

[11] Patent Number: 6,080,613
[45] Date of Patent: *Jun. 27, 2000

[54] METHODS OF FORMING INTEGRATED CIRCUIT MEMORY DEVICES HAVING IMPROVED BIT LINE AND STORAGE ELECTRODE CONTACT REGIONS THEREIN

[75] Inventors: Young-woo Seo; Dug-dong Kang; Sun-cheol Hong; Won-cheol Hong, all of Kyungki-do, Rep. of Korea

[73] Assignee: Samsung Electronics Co., Ltd., Rep. of Korea

[ * ] Notice: This patent is subject to a terminal disclaimer.

[21] Appl. No.: 08/764,202

[22] Filed: Dec. 13, 1996

[30] Foreign Application Priority Data

Dec. 15, 1995 [KR] Rep. of Korea ........................ 95-50683

[51] Int. Cl.[7] ................................................ H01L 21/8234
[52] U.S. Cl. ......................... 438/238; 438/239; 438/250; 438/251; 438/252; 438/253; 438/381; 438/393; 438/394; 438/395; 438/396
[58] Field of Search .................................... 438/238, 239, 438/250, 253, 393, 396, 381, 394, 395, 251, 252

[56] References Cited

U.S. PATENT DOCUMENTS

| | | | |
|---|---|---|---|
| 4,277,882 | 7/1981 | Crossley | 29/571 |
| 4,716,126 | 12/1987 | Cogan | 437/24 |
| 5,100,826 | 3/1992 | Dennison | 437/52 |
| 5,187,122 | 2/1993 | Bonis | 437/200 |
| 5,194,929 | 3/1993 | Ohshima et al. | 257/326 |
| 5,196,365 | 3/1993 | Gotou | 437/52 |
| 5,198,386 | 3/1993 | Gonzalez | 437/52 |
| 5,250,832 | 10/1993 | Murai | 257/306 |
| 5,270,238 | 12/1993 | Kim | 437/52 |
| 5,276,346 | 1/1994 | Iwai et al. | 257/360 |
| 5,315,141 | 5/1994 | Kim | 257/308 |
| 5,320,976 | 6/1994 | Chin et al. | 437/48 |
| 5,389,558 | 2/1995 | Suwanai et al. | 437/52 |
| 5,395,784 | 3/1995 | Lu et al. | 437/52 |
| 5,396,451 | 3/1995 | Ema | 365/51 |
| 5,569,616 | 10/1996 | Ohki et al. | 437/44 |
| 5,624,863 | 4/1997 | Helm et al. | 438/210 |
| 5,770,497 | 6/1998 | Wu et al. | 438/238 |
| 5,780,336 | 7/1998 | Son et al. | 438/251 |
| 5,783,470 | 7/1998 | Rostoker | 438/253 |
| 5,801,065 | 9/1998 | Rizvi et al. | 437/60 |
| 5,812,443 | 9/1998 | Lee et al. | 365/149 |
| 5,926,707 | 7/1999 | Seo | 438/238 |

*Primary Examiner*—John F. Niebling
*Assistant Examiner*—Lynne Gurley
*Attorney, Agent, or Firm*—Myers Bigel Sibley & Sajovec

[57] ABSTRACT

Methods of forming integrated circuit memory devices, such as DRAM memory cells, include the steps of simultaneously forming storage electrode and bit line contact regions of first conductivity type in a semiconductor region of second conductivity type. The contact regions preferably receive a double dose of first conductivity type dopants. This double dose compensates for etching damage caused during processing and improves the memory cell's refresh characteristics. The preferred methods of forming DRAM memory cells include the steps of forming an electrically insulating layer on a face of a semiconductor substrate containing a region of second conductivity type therein (e.g., P-type) extending to the face, and then forming a word line (or segment thereof) on the electrically insulating layer, opposite the region of second conductivity type. Contact regions of first conductivity type for a storage electrode and bit line are then formed at the same time at adjacent opposing edges of the word lines by implanting dopants of first conductivity type into the region of second conductivity type using the word line as an implant mask. A storage electrode of a capacitor is then formed on (or coupled to) the storage electrode contact region adjacent a first edge of the word line and a bit line is also preferably formed on (or coupled to) the bit line contact region adjacent a second edge of the word line. The bit line contact region and storage electrode contact region preferably receive a double dose of first conductivity type dopants by performing a first ion implant step, forming sidewall spacers on the first and second edges of the word line and then performing a second ion implant step using the sidewall spacers as an implant mask.

18 Claims, 6 Drawing Sheets

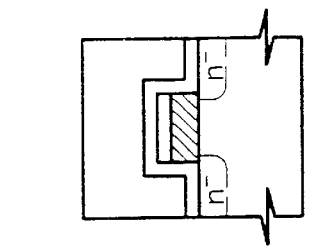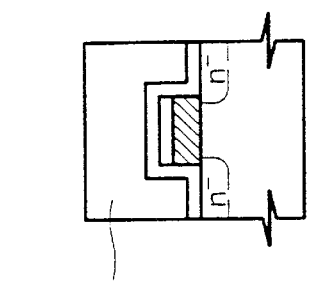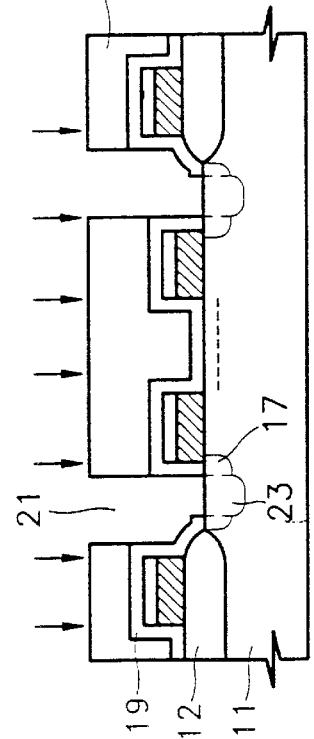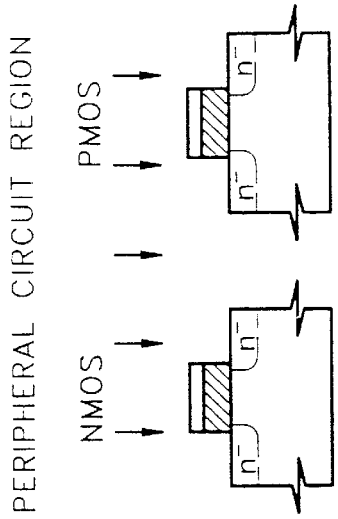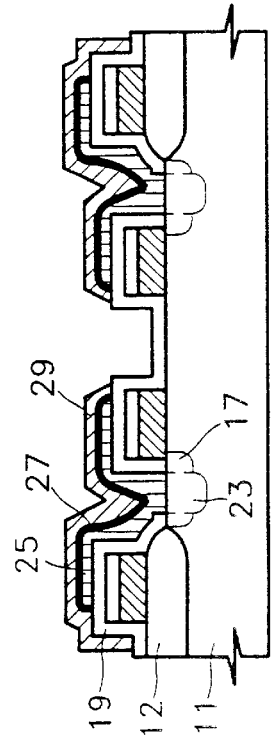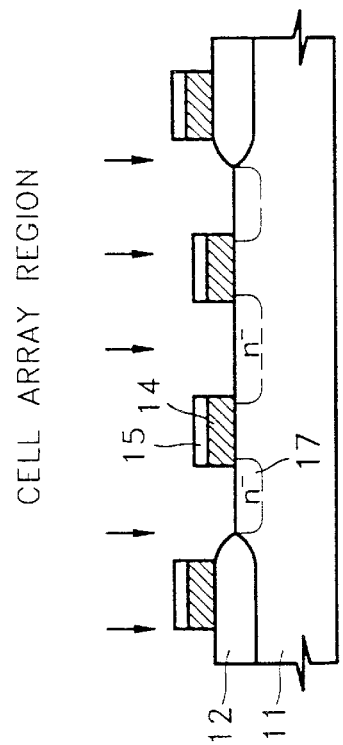
FIG. 1 (PRIOR ART)
FIG. 2 (PRIOR ART)
FIG. 3 (PRIOR ART)

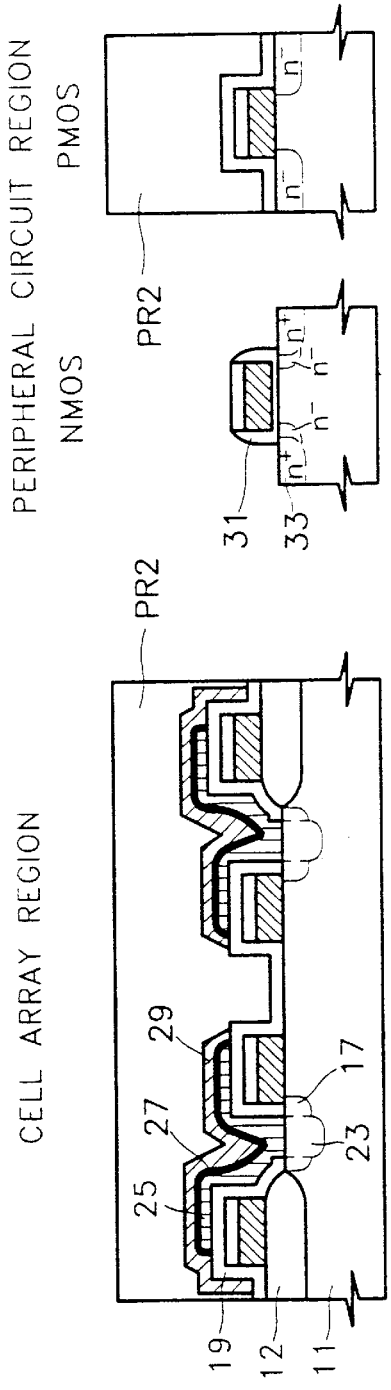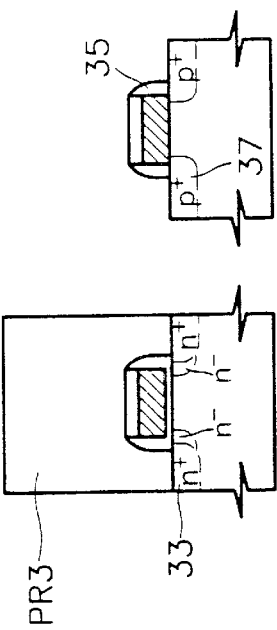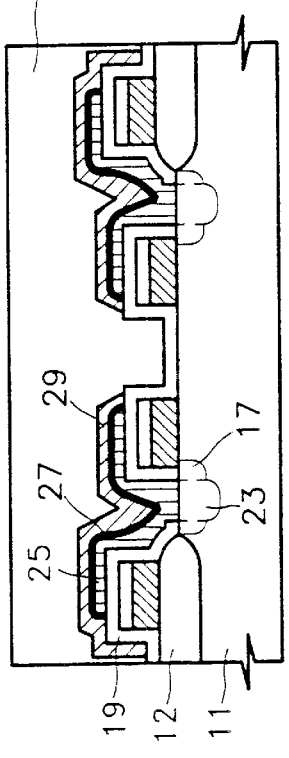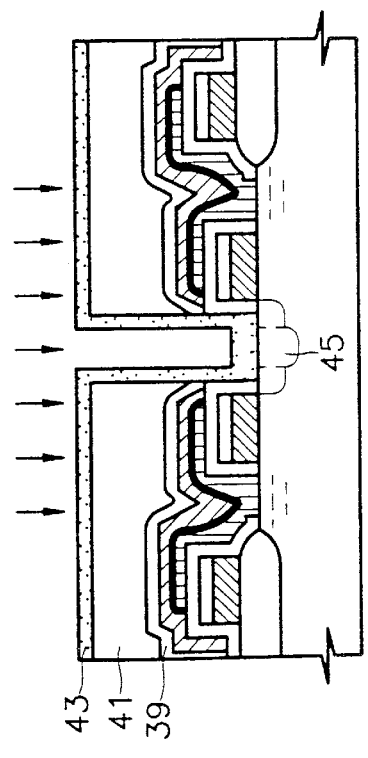
FIG. 4 (PRIOR ART)
FIG. 5 (PRIOR ART)
FIG. 6 (PRIOR ART)

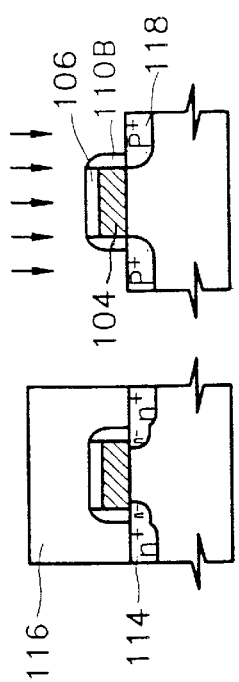
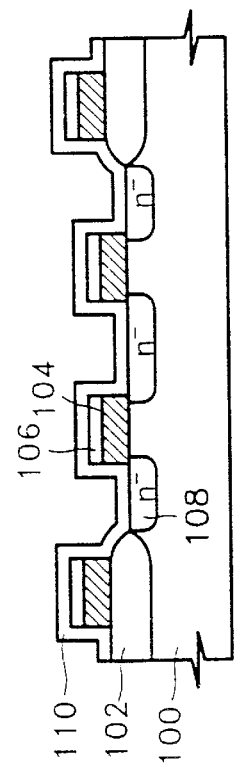
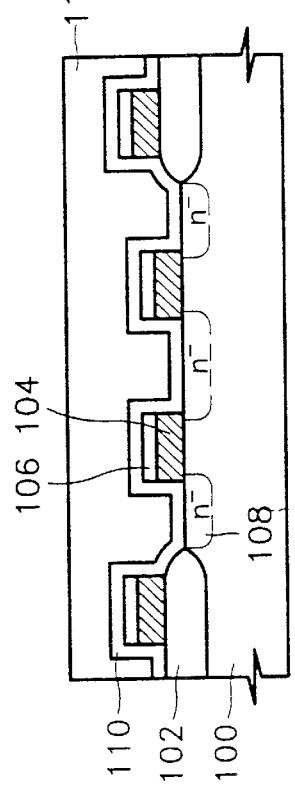
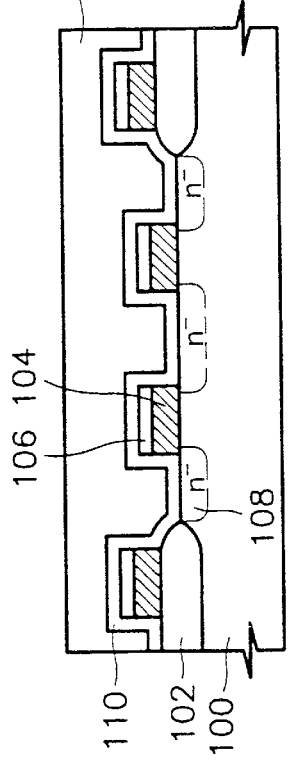

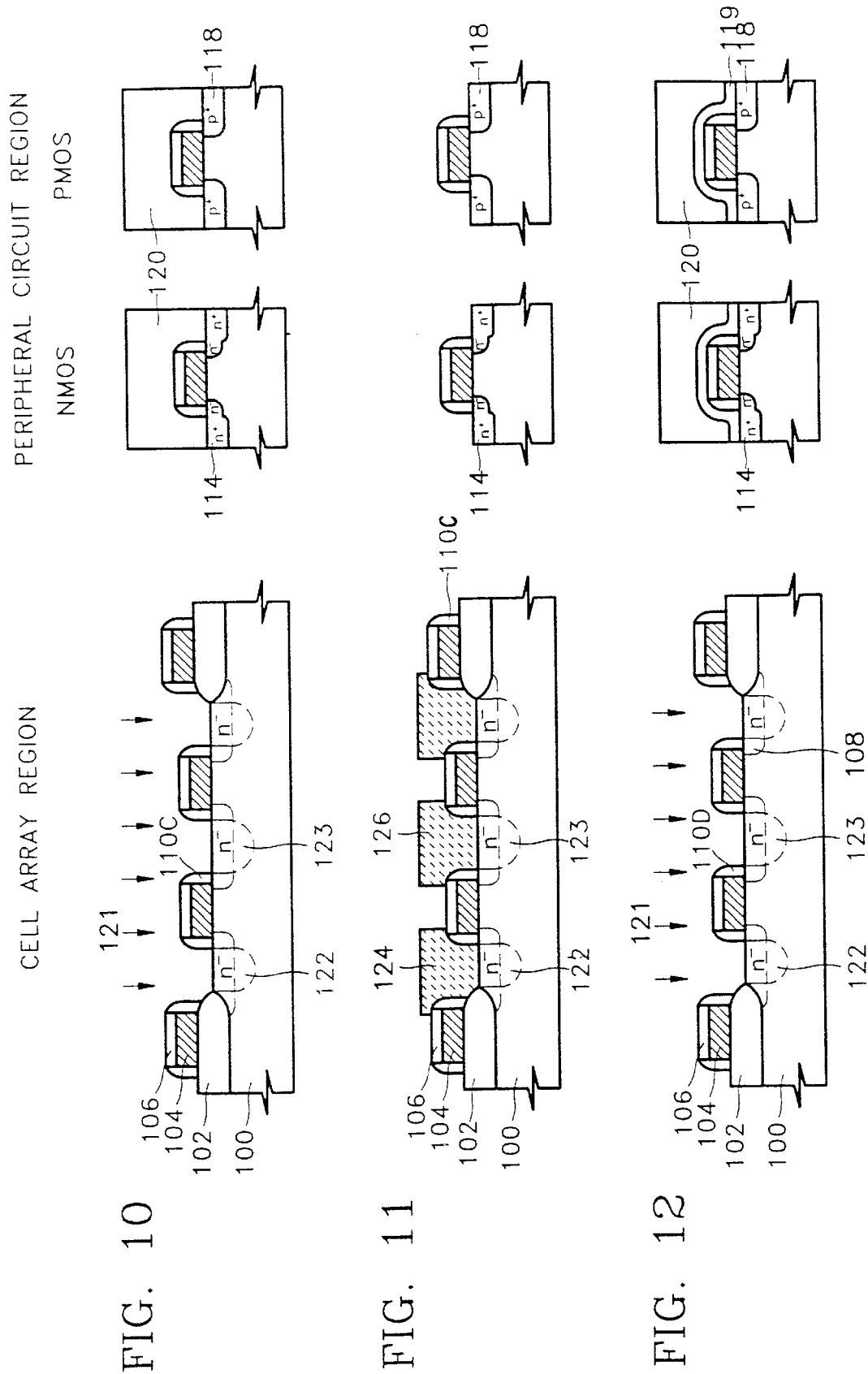

METHODS OF FORMING INTEGRATED CIRCUIT MEMORY DEVICES HAVING IMPROVED BIT LINE AND STORAGE ELECTRODE CONTACT REGIONS THEREIN

FIELD OF THE INVENTION

The present invention relates to semiconductor devices and methods of fabrication, and more particularly to methods of forming integrated circuit memory devices.

BACKGROUND OF THE INVENTION

The reduction in DRAM memory cell refresh times at high integration densities is frequently caused by, among other things, parasitic short-channel induced charge leakage from the cell's storage capacitor. To address this reduction, attempts have been made to implant plug ions into the cell's contact regions to reduce leakage currents. A method according to one such attempt is illustrated by FIGS. 1–6. In particular, FIG. 1 illustrates a semiconductor substrate 11 having a cell array region and a peripheral circuit region. The cell array region is defined by a field oxide isolation region 12. This conventional method includes the steps of forming a blanket gate oxide film (not shown) on a face of the substrate 11. A conductive layer and insulating layer are then deposited and patterned to form insulated electrodes 14 having insulating caps 15 thereon. Next, lightly doped N-type regions 17 are formed by implanting N-type dopants into the substrate 11.

Referring now to FIG. 2, a blanket insulating film 19 is then deposited on the substrate 11. Then, a photoresist layer PR1 is patterned and used as an etching mask to form contact holes 21 in the blanket insulating film 19. A plug ion implanting step is then performed to reduce leakage currents from subsequently formed electrodes of storage capacitors, by recovering the damage generating in the semiconductor substrate 11 when the contact holes 21 were formed. Based on the plug ion implanting step, second impurity regions 23 are formed. Referring now to FIG. 3, the layer of photoresist PR1 is removed and then a layer of polysilicon is deposited in the contact holes 21 and patterned to form storage electrodes 25. Using conventional techniques, a dielectric film 27 and plate electrode 29 are then formed in sequence to complete the formation of storage capacitors.

As illustrated best by FIG. 4, a second layer of photoresist is patterned to expose a portion of the peripheral circuit region where NMOS transistors are to be formed. A selective etching step is then performed to convert the exposed insulating film 19 to sidewall spacers 31 and then a self-aligned high dose implantation step is performed to form N-type source and drain regions 33. Similarly, as illustrated by FIG. 5, a third layer of photoresist is patterned to expose a portion of the peripheral circuit region where PMOS transistors are to be formed. A selective etching step is then performed to convert the exposed insulating film 19 to sidewall spacers 35. A self-aligned high dose implantation step is then performed to form P-type source and drain regions 37.

Finally, as illustrated best by FIG. 6, the third layer of photoresist is removed and then a blanket insulating film 39 is deposited. A planarization step is then performed using another insulating film 41 such as borophosphosilicate glass (BPSG). A layer of photoresist (not shown) is then patterned and used as an etching mask to form a bit line contact hole. A layer of undoped polysilicon is then deposited into the bit line contact hole and patterned to form a bit line 43. Thereafter, plug ions are implanted to reduce the contact resistance between the bit line 43 and the cell active area, and thereby form a bit line contact region 45.

Notwithstanding the above described method of forming DRAM memory cells which includes steps of forming storage electrode contact regions and bit line contact regions in sequence, there continues to be a need for improved methods of forming integrated circuit memory devices containing memory cells therein.

SUMMARY OF THE INVENTION

It is therefore an object of the present invention to provide improved methods of forming integrated circuit memory devices.

It is another object of the present invention to provide methods of forming integrated circuit memory devices having improved memory refresh characteristics.

It is still another object of the present invention to provide methods of forming integrated circuit memory devices requiring a reduced number of process steps.

These and other objects, features and advantages of the present invention are provided by methods of forming integrated circuit memory devices, such as DRAM memory cells, which include the steps of simultaneously forming storage electrode and bit line contact regions of first conductivity type in a semiconductor region of second conductivity type. The contact regions preferably receive a double dose of first conductivity type dopants. This double dose compensates for etching, implant and field oxide growth damage caused during processing and improves the memory cell's refresh characteristics by inhibiting charge leakage from a storage capacitor. In particular, preferred methods of forming DRAM memory cells include the steps of forming an electrically insulating layer on a face of a semiconductor substrate containing a region of second conductivity type therein (e.g., P-type) extending to the face, and then forming a word line (or segment thereof) on the electrically insulating layer, opposite the region of second conductivity type. Contact regions of first conductivity type for a storage electrode and bit line are then formed at the same time at adjacent opposing edges of the word lines by implanting dopants of first conductivity type into the region of second conductivity type using the word line as an implant mask. A storage electrode of a capacitor is then formed on (or coupled to) the storage electrode contact region at a position adjacent a first edge of the word line and a bit line is also preferably formed on (or coupled to) the bit line contact region at a position adjacent a second edge of the word line.

The bit line contact region and storage electrode contact region preferably receive a double dose of first conductivity type dopants. The double dose is achieved by performing a first ion implantation step, forming sidewall spacers on the first and second edges of the word line and then performing a second ion implantation step using the sidewall spacers as an implant mask. To increase the conductivity of the contact regions, the sidewall spacers may also thinned to about 50 Å by performing a wet etching step using a solution containing HF. This step increases the area exposed by the sidewall spacers so that a greater amount of dopant can be implanted during the second ion implantation step. These steps of forming a storage electrode of a capacitor and bit line may also include the steps of forming polysilicon pads of first conductivity type (as intermediate contacts) on the contact regions and then diffusing dopants from the pads into the contact regions. The incorporation of additional dopants into the contact regions also reduces the magnitude of leakage currents from the storage electrode and thereby improves the memory cell's refresh characteristics

BRIEF DESCRIPTION OF THE DRAWINGS

FIGS. 1–6 illustrate schematic cross-sectional views of intermediate structures illustrating a method of forming an integrated circuit memory device to the prior art.

FIGS. 7–11 illustrate schematic cross-sectional views of intermediate structure illustrating a method of forming an integrated circuit memory device according to a first embodiment of the present invention.

FIG. 12 illustrates a schematic cross-sectional view of an intermediate structure which when combined with FIGS. 7–9 and 11 illustrates a method of forming an integrated circuit memory device according to a second embodiment of the present invention.

DESCRIPTION OF PREFERRED EMBODIMENTS

Figure 13:
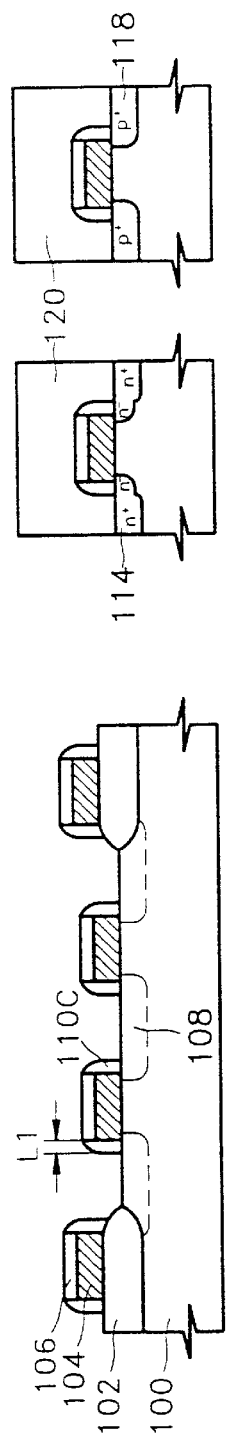
FIGS. 13–15 illustrate schematic cross-sectional views of intermediate structures which when combined with FIGS. 7–9 illustrate a method of forming an integrated circuit memory device according to a third embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type and each embodiment described and illustrated herein includes its complementary embodiment as well.

Referring now to FIGS. 7–11, a method of forming an integrated circuit memory device according to a first embodiment of the present invention will now be described. In particular, FIG. 7 illustrates an intermediate structure of an integrated circuit memory device having a memory cell array region wherein DRAM memory cells are to be formed and a peripheral circuit region wherein peripheral devices are to be formed including NMOS and PMOS transistors. A method according to a first embodiment of the present invention includes the steps of forming a first insulating layer (e.g., $SiO_2$) on a face of a semiconductor substrate 100 of predetermined conductivity type (e.g., P-type). In the peripheral circuit region, the first insulating layer may comprise a gate oxide layer of predetermined thickness, as will be understood by those skilled in the art. However, in the cell array region, the first insulating layer is preferably formed on a portion of the face of the substrate 100 commonly referred to as an active region. This active region is defined by an opening in a field oxide isolation region 102. The first insulating layer may be a layer of deposited or thermally grown silicon dioxide. A conductive layer and capping oxide layer are then formed on the first insulating layer and patterned using conventional techniques to form a plurality of insulated electrodes 104 having oxide caps 106. As described more fully hereinbelow, the insulated electrodes 104 may be patterned as word lines which extend in a third dimension (not shown) to interconnect adjacent memory cells. In the peripheral circuit region, the insulated electrodes 104 may be patterned as insulated gate electrodes of the NMOS and PMOS transistors.

According to a preferred aspect of the present invention, the conductive layer may be formed as a composite layer of polycrystalline silicon and tungsten silicide ($WSi_x$). Dopants of first conductivity type (e.g., N-type) are then implanted into the face of the substrate 100 to form a plurality of preliminary contact regions 108 of first conductivity type in the cell array region and a plurality of LDD source and drain regions in the peripheral circuit region. These first conductivity type dopants are implanted in a self-aligned manner using the insulated electrodes 104 as an implant mask. Referring still to FIG. 7, a blanket second electrically insulating layer 110 (e.g., $SiO_2$) is then formed on the preliminary contact regions 108, the LDD source and drain regions and on the insulated electrodes 104. This blanket second electrically insulating layer 110 may have thickness in a range between about 1500 and 2000 Å.

Referring now to FIG. 8, a first layer of photoresist 112 is then patterned to expose the portion of the substrate where NMOS transistors are to be formed. A selective etching step is then performed to convert an exposed portion of the second electrically insulating layer 110 to sidewall spacers 110A and then source and drain regions 114 (shown as N+) are formed by implanting first conductivity type dopants into the LDD source and drain regions, using the exposed insulated gate electrode 104 and sidewall spacers 110A as an implant mask. Referring now to FIG. 9, a second layer of photoresist 116 is then patterned to expose the portion of the substrate where PMOS transistors are to be formed. A selective etching step is then performed again to convert an exposed portion of the second electrically insulating layer 110 to sidewall spacers 110B and then source and drain regions 118 (shown as P+) are formed by implanting second conductivity type dopants into the LDD source and drain regions, using the exposed insulated gate electrode 104 and sidewall spacers 110B as an implant mask.

Referring now to FIG. 10, a third layer of photoresist 120 is then patterned as a mask to expose the cell array region. A selective etching step (e.g., reactive ion etching (RIE)) is then performed to convert an exposed portion of the second electrically insulating layer 110 to sidewall spacers 110C. Cell plug ions 121 are then implanted into the preliminary contact regions 108 using the sidewall spacers 110C as an implant mask. The step of implanting cell plug ions 121 preferably includes the step of implanting phosphorus ions at an energy in a range between about 40 and 60 KeV and at a dose level in a range between about $4 \times 10^{12}$ cm$^{-3}$ and $1 \times 10^{13}$ cm$^{-2}$. This second implanting step is preferably undertaken to form a more highly doped storage electrode contact region 122 and a more highly doped bit line contact region 123. These regions 122 and 123 can contribute to a recovery of etching damage generated in the substrate 100 during the formation of the sidewall spacers 110C, the field oxide isolation region 102, and to a reduction in junction leakage current which improves the memory device's refresh characteristics. Referring now to FIG. 11, the patterned layer of photoresist 120 is then removed, as illustrated. A conductive layer, which may comprise polysilicon of first conductivity type, is then deposited and patterned by etching to form a storage electrode pad 124 and bit line pad 126 as intermediate contacts. During subsequent processing, these pads 124 and 126 can be exposed by etching holes or vias in upper layers of insulation. An electrode of a storage capacitor and a bit line can then be patterned in the holes to electrically contact the pads 124 and 126. Alternatively, the pads 124 and 126 may also constitute the electrodes of a storage capacitor and the bit line, respectively.

As illustrated best by FIG. 12, the step of patterning the layer of photoresist 120 may be preceded by the step of forming another electrically insulating layer 119 in accordance with a second embodiment of the present invention. This electrically insulating layer 119 covers structures located in the peripheral circuit region. The selective etching step (e.g., reactive ion etching (RIE)) described with respect to FIG. 10 can then performed to convert the exposed portion of the electrically insulating layer 119 and the underlying second electrically insulating layer 110 to sidewall spacers 110D. As will be understood by those skilled in the art, the electrically insulating layer 119 can be used to protect the devices in the peripheral circuit region from damage when the conductive layer is etched to form the storage electrode and bit line pads 124 and 126 illustrated by FIG. 11.

Figure 14:
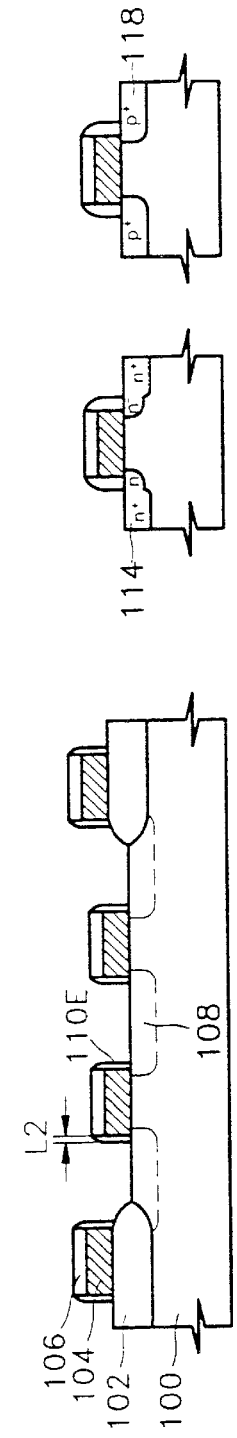
Figure 15:
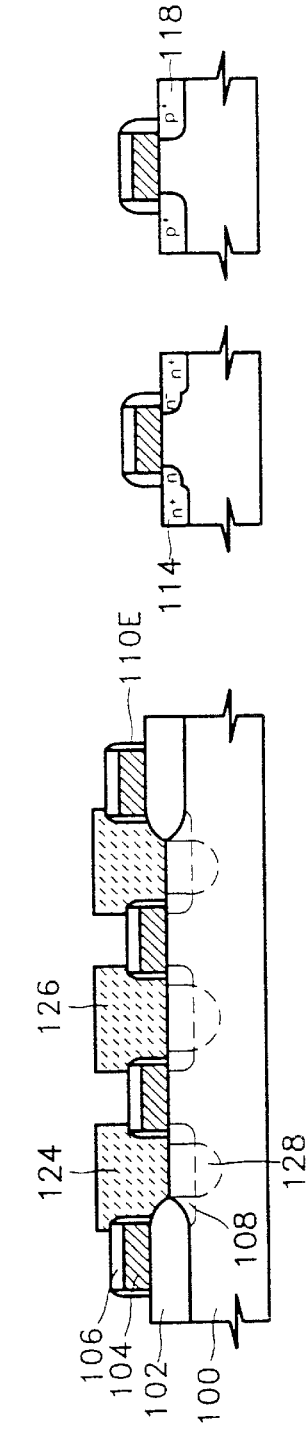

Referring now to FIGS. 13–15, methods of forming integrated circuit memory devices according to a third embodiment of the present invention will now be described. In particular, as best illustrated by FIGS. 13–14, the transverse cross-sectional widths "L1" of the sidewall spacers 110C are preferably reduced to less than about 50 Å (i.e., "L2"$\leq$50 Å) by performing a wet etching step using a solution containing HF. This increases the exposed area of the preliminary storage electrode and bit line contact regions 108. Then, as best illustrated by FIG. 15, first conductivity type dopants are diffused from the pads 124 and 126 into the preliminary contact regions 108 to form contact regions 128 which preferably have a sheet resistance in a range between about 120 to 180 $\Omega/\square$. This step of diffusing dopants from the pads into the preliminary contact regions 108 can be used in place of the step of performing the second implantation of plug ions 121, as illustrated by FIG. 10. The step of diffusing dopants instead of implanting dopants also reduces the amount of damage in the substrate 100 and this typically improves the memory cell's refresh characteristics. Moreover, by thinning the initial sidewall spacers 110C to form final sidewall spacers 110E, the contact resistances between the storage electrode and bit line pads 124 and 126 and the contact regions 128 can also be reduced. The ability to carefully control the amount of dopant diffused from the pads into the substrate 100 also allows the refresh characteristics to be carefully controlled.

Figure 16:
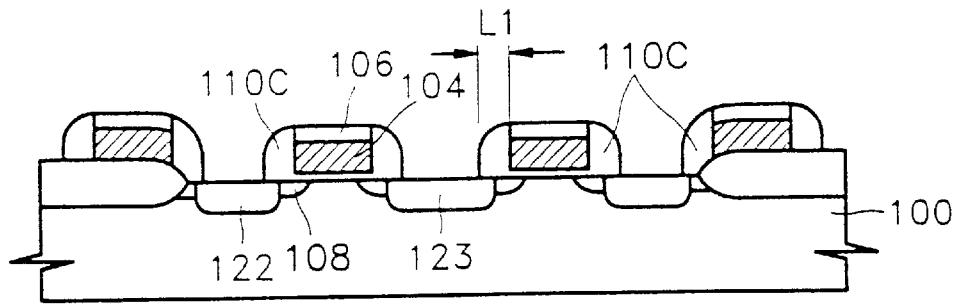
FIGS. 16–18 illustrate schematic cross-sectional views of intermediate structures which when combined with FIGS. 7–9 illustrate a method of forming an integrated circuit memory device according to a fourth embodiment of the present invention.
Figure 17:
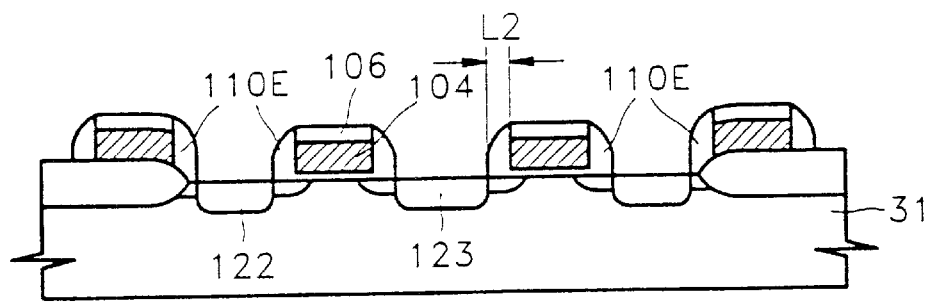
Figure 18:
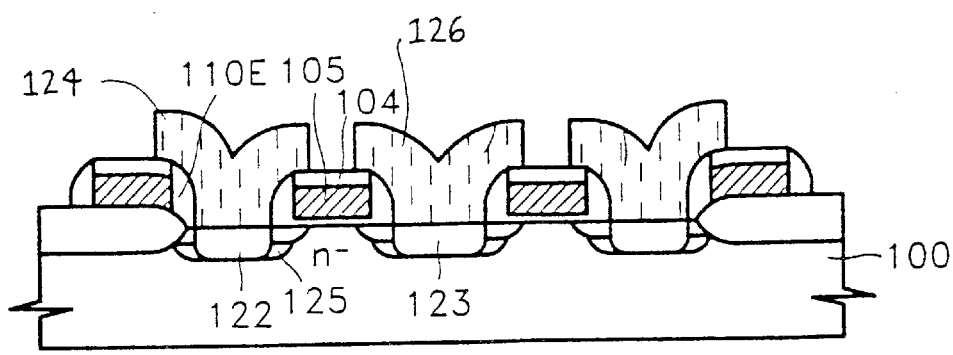

Referring now to FIGS. 16–18, methods of forming integrated circuit memory devices according to a fourth embodiment include steps from the first and third embodiments. In particular, as illustrated by FIGS. 10 and 16, the contact regions 122 and 123 may be formed by performing a second implant of first conductivity type dopants into the preliminary contact regions 108. Then, as illustrated by FIGS. 14 and 17, the sidewall spacers 110C can be thinned so that "L2" is less than about 50 Å, using a wet etching step. Finally, as illustrated by FIGS. 15 and 18, first conductivity type dopants are diffused from the pads 124 and 126 into the contact regions 122 and 123, as illustrated by regions 125.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising the steps of:

forming an insulated electrode of a memory cell on a face of a semiconductor substrate;

implanting first dopants of first conductivity type into the exposed face of the substrate at the first and second ends of the insulated gate electrode to form preliminary storage electrode and bit line contact regions; then forming sidewall spacers on the first and second ends of the insulated gate electrode; then thinning the sidewall spacers by exposing the sidewall spacers to a wet etchant; then implanting second dopants of first conductivity type into the preliminary storage electrode and bit line contact regions, using the insulated gate electrode and sidewall spacers as an implant mask;

forming a storage capacitor having an electrode coupled to the storage electrode contact region, on the substrate; and forming a bit line coupled to the bit line contact region, on the substrate.

2. The method of claim 1, wherein said step of forming an insulated electrode comprises the steps of:

forming a first insulating layer on the face of the substrate;

forming a conductive layer on the first insulating layer, opposite the face; and patterning the conductive layer and the first insulating layer to define an insulated electrode having first and second ends and expose the face of the substrate.

3. The method of claim 1, wherein said step of forming sidewall spacers comprises depositing an insulating layer having a thickness greater than 100 Å on the preliminary storage electrode and bit line contact regions and on the insulated electrode and then selectively etching the deposited insulating layer from the preliminary storage electrode and bit line contact regions and from a top surface of the insulated electrode.

4. The method of claim 3, wherein said thinning step comprises wet etching the sidewall spacers to have a thickness less than about 50 Å.

5. The method of claim 4, wherein said step of forming sidewall spacers comprises depositing an insulating layer having a thickness in a range between about 1500 and 2000 Å on the preliminary storage electrode and bit line contact regions and on the insulated electrode and then selectively etching the deposited insulating layer; and wherein said wet etching step comprises etching the sidewall spacers in a solution containing HF.

6. The method of claim 2, wherein said step of forming a storage capacitor comprises forming a polycrystalline silicon storage electrode pad of first conductivity type in ohmic contact with the storage electrode contact region; and wherein said step of forming a bit line comprises forming a polycrystalline silicon bit line pad of first conductivity type in ohmic contact with the bit line contact region.

7. The method of claim 6, further comprising the step of diffusing dopants of first conductivity type from the storage electrode pad and bit line pad into the storage electrode contact region and bit line contact region, respectively.

8. The method of claim 2, wherein said step of implanting second dopants of first conductivity type comprises implanting phosphorus ions at an energy in a range between about 40 and 60 KeV and at a dose level in a range between about $4\times10^{12}$ cm$^{-2}$ and $1\times10^{13}$ cm$^{-2}$.

9. A method of forming a DRAM memory cell, comprising the steps of:

forming an electrically insulating layer on a face of a semiconductor substrate containing a region of second conductivity type therein extending to the face;

forming a word line on the electrically insulating layer, opposite the region of second conductivity type;

implanting first dopants of first conductivity type into the region of second conductivity type at the first and second opposing edges of the word line to form preliminary storage electrode and bit line contact regions; then forming sidewall spacers on the first and second edges of the word line; then thinning the sidewall spacers by exposing the sidewall spacers to a wet etchant; then implanting second dopants of first conductivity type into the preliminary storage electrode and bit line contact regions, using the word line and the sidewall spacers as an implant mask;

forming a storage electrode of a capacitor electrically connected to the storage electrode contact region; and forming a bit line electrically connected to the bit line contact region.

10. The method of claim 9, wherein said step of forming a word line comprises forming a word line containing WSi$_x$ on the electrically insulating layer.

11. The method of claim 9, wherein said step of forming sidewall spacers comprises depositing an insulating layer having a thickness greater than 100 Å on the preliminary storage electrode and bit line contact regions and on the word line and then selectively etching the deposited insulating layer from the preliminary storage electrode and bit line contact regions and from a top surface of the word line.

12. The method of claim 11, wherein said thinning step comprises wet etching the sidewall spacers to have a thickness less than about 50 Å.

13. The method of claim 12, wherein said step of forming sidewall spacers comprises depositing an insulating layer having a thickness in a range between about 1500 and 2000 Å on the preliminary storage electrode and bit line contact regions and on the word line and then selectively etching the deposited insulating layer from the preliminary storage electrode and bit line contact regions and from a top surface of the word line; and wherein said wet etching step comprises etching the sidewall spacers in a solution containing HF.

14. The method of claim 13, wherein said step of forming a storage electrode comprises forming a polycrystalline silicon storage electrode pad of first conductivity type in ohmic contact with the storage electrode contact region; and wherein said step of forming a bit line comprises forming a polycrystalline silicon bit line pad of first conductivity type in ohmic contact with the bit line contact region.

15. The method of claim 14, further comprising the step of diffusing dopants of first conductivity type from the storage electrode pad and bit line pad into the storage electrode contact region and bit line contact region, respectively.

16. The method of claim 9, wherein said step of implanting second dopants of first conductivity type comprises implanting phosphorus ions at an energy in a range between about 40 and 60 KeV and at a dose level in a range between about $4\times10^{12}$ cm$^{-2}$ and $1\times10^{13}$ cm$^{-2}$.

17. The method of claim 16, further comprising the step of diffusing dopants of first conductivity type from the storage electrode pad and bit line pad into the storage electrode contact region and bit line contact region, respectively.

18. A method of forming an integrated circuit memory device, comprising the steps of:

forming an insulated electrode of a memory cell on a face of a semiconductor substrate;

implanting first dopants of first conductivity type into the exposed face of the substrate at the first and second ends of the insulated gate electrode to form preliminary storage electrode and bit line contact regions; then forming sidewall spacers on the first and second ends of the insulated gate electrode; then thinning the sidewall spacers by exposing the sidewall spacers to a wet etchant;

forming a storage capacitor having a polycrystalline silicon electrode of first conductivity type electrically coupled to the storage electrode contact region, on the substrate;

forming a polycrystalline silicon bit line of first conductivity type electrically coupled to the bit line contact region, on the substrate; and diffusing dopants of first conductivity type from the polycrystalline silicon electrode into the storage electrode contact region while simultaneously diffusing dopants of first conductivity type from the polycrystalline silicon bit line into the bit line contact region.

* * * * *